(12) United States Patent
Campbell et al.

(10) Patent No.: US 6,784,018 B2
(45) Date of Patent: Aug. 31, 2004

(54) METHOD OF FORMING CHALCOGENIDE COMPRISING DEVICES AND METHOD OF FORMING A PROGRAMMABLE MEMORY CELL OF MEMORY CIRCUITRY

(75) Inventors: Kristy A. Campbell, Boise, ID (US); John T. Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/943,187

(22) Filed: Aug. 29, 2001

(65) Prior Publication Data

US 2003/0049912 A1 Mar. 13, 2003

(51) Int. Cl.[7] .............................................. H01L 21/06
(52) U.S. Cl. ...................... 438/102; 438/103; 438/84; 438/308; 438/522; 438/537; 438/558
(58) Field of Search .............................. 438/102, 558, 438/84, 304, 522, 537, 130, 131, 795, 798, 923, 914, 95, 213, 103, 308

(56) References Cited

U.S. PATENT DOCUMENTS

| | | | |
|---|---|---|---|
| 3,622,319 A | 11/1971 | Sharp ............................ 96/27 |
| 3,743,847 A | 7/1973 | Boland ........................ 250/510 |
| 4,269,935 A | 5/1981 | Masters et al. ............. 430/323 |
| 4,312,938 A | 1/1982 | Drexler et al. .............. 430/496 |
| 4,316,946 A | 2/1982 | Masters et al. |
| 4,320,191 A | * 3/1982 | Yoshikawa et al. ............ 216/67 |
| 4,368,099 A | * 1/1983 | Huggett et al. ................ 216/48 |
| 4,405,710 A | 9/1983 | Balasubramanyam et al. ........................... 430/311 |
| 4,419,421 A | 12/1983 | Wichelhaus et al. ......... 429/191 |
| 4,434,217 A | * 2/1984 | Masters et al. ............... 430/14 |
| 4,499,557 A | 2/1985 | Holmberg et al. ........... 365/163 |
| 4,671,618 A | 6/1987 | Wu et al. |
| 4,795,657 A | 1/1989 | Formigoni et al. ............ 427/96 |
| 4,800,526 A | 1/1989 | Lewis |
| 4,847,674 A | 7/1989 | Sliwa et al. .................. 357/67 |

(List continued on next page.)

FOREIGN PATENT DOCUMENTS

| | | |
|---|---|---|
| JP | 56126916 A | 10/1981 |
| WO | WO-97 48032 | 12/1997 |
| WO | WO 97/48032 | 12/1997 |
| WO | WO 99/28914 | 6/1999 |
| WO | WO-00 48196 | 8/2000 |
| WO | 00/48196 A1 | 8/2000 |
| WO | 09/21542 A1 | 3/2002 |

OTHER PUBLICATIONS

U.S. patent application Ser. No. 09/921,518, Moore et al., filed Aug. 1, 2001.

(List continued on next page.)

*Primary Examiner*—Amir Zarabian
*Assistant Examiner*—Khanh Duong
(74) *Attorney, Agent, or Firm*—Dickstein Shapiro Morin & Oshinsky LLP (57) ABSTRACT

A first conductive electrode material is formed on a substrate. Chalcogenide comprising material is formed thereover. The chalcogenide material comprises $A_xSe_y$. A silver comprising layer is formed over the chalcogenide material. The silver is irradiated effective to break a chalcogenide bond of the chalcogenide material at an interface of the silver comprising layer and chalcogenide material and diffuse at least some of the silver into the chalcogenide material. After the irradiating, the chalcogenide material outer surface is exposed to an iodine comprising fluid effective to reduce roughness of the chalcogenide material outer surface from what it was prior to the exposing. After the exposing, a second conductive electrode material is deposited over the chalcogenide material, and which is continuous and completely covering at least over the chalcogenide material, and the second conductive electrode material is formed into an electrode of the device.

51 Claims, 3 Drawing Sheets

U.S. PATENT DOCUMENTS

| | | | |
|---|---|---|---|
| 5,177,567 A | 1/1993 | Klersy et al. ................... 257/4 |
| 5,219,788 A | 6/1993 | Abernathey et al. ......... 437/187 |
| 5,238,862 A | 8/1993 | Blalock et al. |
| 5,272,359 A | 12/1993 | Nagasubramanian et al. |
| 5,314,772 A | 5/1994 | Kozicki |
| 5,315,131 A | 5/1994 | Kishimoto et al. ............ 257/57 |
| 5,350,484 A | 9/1994 | Gardner et al. .............. 156/628 |
| 5,360,981 A | 11/1994 | Owen et al. |
| 5,500,532 A | 3/1996 | Kozicki |
| 5,512,328 A | 4/1996 | Yoshimura et al. .......... 427/498 |
| 5,512,773 A | 4/1996 | Wolf et al. ................. 257/471 |
| 5,726,083 A | 3/1998 | Takaishi ..................... 438/187 |
| 5,751,012 A | 5/1998 | Wolstenholme et al. ....... 257/5 |
| 5,761,115 A | 6/1998 | Kozicki et al. |
| 5,789,277 A | 8/1998 | Zahorik et al. ............... 438/95 |
| 5,841,150 A | 11/1998 | Gonzalez et al. .............. 257/3 |
| 5,846,889 A | 12/1998 | Harbison et al. ............ 501/40 |
| 5,896,312 A | 4/1999 | Kozicki et al. |
| 5,914,893 A | 6/1999 | Kozicki et al. |
| 5,920,788 A | 7/1999 | Reinberg .................... 438/466 |
| 5,998,066 A | 12/1999 | Block et al. .................... 430/5 |
| 6,033,766 A * | 3/2000 | Block et al. ................ 428/210 |
| 6,072,716 A | 6/2000 | Jacobson et al. |
| 6,077,729 A | 6/2000 | Harshfield .................. 438/128 |
| 6,084,796 A | 7/2000 | Kozicki et al. |
| 6,117,720 A | 9/2000 | Harshfield .................. 438/238 |
| 6,143,604 A | 11/2000 | Chiang et al. .............. 438/253 |
| 6,177,338 B1 | 1/2001 | Liaw et al. .................. 438/629 |
| 6,236,059 B1 | 5/2001 | Wolstenholme et al. ........ 257/3 |
| 6,297,170 B1 | 10/2001 | Gabriel et al. .............. 438/738 |
| 6,300,684 B1 | 10/2001 | Gonzalez et al. .............. 257/3 |
| 6,316,784 B1 | 11/2001 | Zahorik et al. ................ 257/3 |
| 6,329,606 B1 | 12/2001 | Freyman et al. ............. 174/260 |
| 6,348,365 B1 * | 2/2002 | Moore et al. ............... 438/130 |
| 6,350,679 B1 | 2/2002 | McDaniel et al. .......... 438/634 |
| 6,376,284 B1 | 4/2002 | Gonzalez et al. ........... 438/129 |
| 6,388,324 B2 | 5/2002 | Kozicki |
| 6,391,688 B1 | 5/2002 | Gonzalez et al. ........... 438/128 |
| 6,414,376 B1 | 7/2002 | Thakur et al. ............... 257/640 |
| 6,418,049 B1 | 7/2002 | Kozicki et al. ............. 365/174 |
| 6,423,628 B1 | 7/2002 | Li et al. ..................... 438/622 |
| 6,469,364 B1 | 10/2002 | Kozicki |
| 6,473,332 B1 | 10/2002 | Ignatiev et al. |
| 6,487,106 B1 | 11/2002 | Kozicki |
| 2002/0000666 A1 | 1/2002 | Kozicki et al. |
| 2002/0123170 A1 | 9/2002 | Moore et al. |
| 2002/0127886 A1 | 9/2002 | Moore et al. |
| 2002/0163628 A1 | 11/2002 | Krieger et al. |
| 2002/0168820 A1 | 11/2002 | Kozicki |
| 2002/0190350 A1 | 12/2002 | Kozicki |
| 2003/0001229 A1 | 1/2003 | Moore et al. |
| 2003/0027416 A1 | 2/2003 | Moore |
| 2003/0035314 A1 | 2/2003 | Kozicki |
| 2003/0035315 A1 | 2/2003 | Kozicki |

OTHER PUBLICATIONS

U.S. patent application Ser. No. 09/999,883, Moore et al., filed Mar. 1, 2001.

U.S. patent application Ser. No. 10/061,825, Gilton et al., Jan 31, 2002.

Das et al., *Theory of the characteristic curves of the silver chalcogenide glass inorganic photoresists,* 54 Appl. Phys. Lett., No. 18, pp. 1745–1747 (May 1989).

Helbert et al., *Intralevel hybrid resist process with submicron capability,* SPIE vol. 333 Submicron Lithography, pp. 24–29 (1982).

Hilt, Dissertation: *Materials Characterization of Silver Chalcogenide Programmable Metallization Cells,* Arizona State University, pp. title p. 114 (UMI Company, May 1999).

Helbert et al., *Intralevel hybrid resist process with submicron capability,* SPIE vol. 333 Submicron Lithography, pp. 24–29 (1982).

Hilt, Dissertation: *Materials characterization of Silver Chalcogenide Programmable Metalization Cells,* Arizona State University, pp. Title page–114 (UMI Company, May 1999).

Holmquist et al., *Reaction and Diffusion in Silver–Arsenic Chalcogenide Glass Systems,* 62 J. Amer. Ceramic. Soc., No. 3–4, pp. 183–188 (Mar.–Apr. 1979).

Huggett et al., *Development of silver sensitized germanium selenide photoresist by reactive sputter etching in $SF_{62}$,* 42 Appl. Phys. Lett., No. 7, pp. 592–594 (Apr. 1983).

Kawaguchi et al., *Mechanism of photosurface deposition,* 164–166 J. Non–Cryst. Solids, pp. 1231–1234 (1993).

McHardy et al., *The dissolution of metals in amorphous chalcogenides and the effects of electron and ultraviolet radiation,* 20 J. Phys. C.: Solid State Phys., pp. 4055–4075 (1987).

Miyatani, *Electrical Porperties of $Ag_2Se$,* 13 J. Phys. Soc. Japan, p. 317 (1958).

Mizusaki et al. *Kinetic Studies on the Selenization of Silver,* 47 Bul. Chem. Soc. Japan,, No. 11 pp. 2851–2855 (Nov. 1974).

Owen et al., *Metal–Chalcogenide Photoresists for High Resolution Lithography and Sub–Micron Structures,* Nanostructure Physics and Fabrication, pp. 447–451 (Academic Press, 1989).

Safran et al., *TEM study of $Ag_2Se$ developed by the reaction of polycrystalline silver films and selenium,* 317 Thin Solid Films, pp. 72–76 (1998).

Shimizu et al., *The Photo–Erasable Memory Switching Effect of Ag Photo–Doped Chalcogenide Glasses,* 46 Bul. Chem. Soc. Japan, No. 12, pp. 3662–3665 (Dec. 1973).

Somogyi et al., *Temperature Dependence of the Carrier Mobility in $Ag_2Se$ Layers Grown on NaCl and $SiO_x$ Substrates,* 74 Acta Physica Hungarica, No. 3, pp. 243–255 (1994).

Tai et al., *Multilevel Ge–Se film based resist systems,* SPIE vol. 333 Submicron Lithography, pp. 32–39 (Mar. 1982).

Tai et al., *Submicron optical lithography using an inorganic resist/polymer bilevel scheme,* 17 J. Vac. Sci. Technol., No. 5, pp. 1169–1176 (Sep./Oct. 1980).

West, Dissertation: *Electrically Erasable Non–Volatile Memory Via electrochemical Deposition of Multifractal Aggregates,* Arizona State University, pp. title p. 168 (UMI Co., May 1998).

West et al., *Equivalent Circuit Modeling of the $Ag \cdot As_{0.24}S_{0.30}Ag_{0.40}|Ag$ System Prepared by Photodissolution of Ag,* 145 J. Electrochem. Soc., No. 9, pp. 2971–2974 (Sep. 1998).

Yoshikawa et al., *A new inorganic electron resist of high contrast,* 31 Appl. Phys. Lett., No. 3, pp. 161–163 (Aug. 1977).

Yoshikawa et al., *Dry development of Se–Ge Inorganic photoresist,* 36 Appl. Phys. Lett., No. 1, pp. 107–109 (Jan. 1980).

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical &amp; thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RgAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidiy percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfind Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2672.

Chen, C.H.; Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemicall durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Propeties of Ag2–xSe1+x/n–Si diodes, Thin Solid Films 110 (1983) 107–113.

El Gharras, Z.; Bourahla, A.; Vautier, C., Role of Photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, U.L., The threshold switching in semiconducting glass Ge21Se17Te62, Indian J. Phys. 70a (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A Unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shari, H.T., Electrical, thermal and optical properties of Se75Ge7Sb18, Vacuum 43 (1992) 253–257.

Feng, X. ;Bresser, W.J.; Boolchand, P., Directed evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) curently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non Cryst. Solids 298 (2002) 260–269.

Guin, J.–P.; Rouxel, T.; Sangleboeuf, J.–C; Melscoet, I.; Lucas, J., Hardness, toughness and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the strucure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen A.E. Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structuress, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys 13 (1974) 1163–1164.

Hegab, N.A.; Fadel, M.; Sedeek, K., Memory switching pehnomena in thin films of chalcogenide semiconductors, Vacuum 45 (1994) 459–462.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectroncis and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 &amp; 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull 8 (1973) 433–442.

Kaplan, T.; Adler, D., Electrothermal switching in amorphous semiconductors. J. Non–Cryst. Solids 8–10 (1972) 538–543.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kolobov, A.V., On the origin of p–type conductivity in amorphous chalcogenides, J. Non–Cryst. Solids 198–200 (1996) 729–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalocogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar. A., Amorphous semiconductor devices: memory and switching mechanism, J. Instn Electronics &amp; Telecom. Engrs 27 (1981) 16–19.

Lal, M.; Goyal N., Chemical bond approach to study the memory and threshold switching chalcogenide glasses, Indian Journal of pure &amp; appl. phys. 29 (1991) 303–304.

Leimer, R.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett., 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films Jpn. J. Appl. Phys. 11 (1972) 606.

Mazurier, F.; Levy, M.; Souquet, J.L, Reversible and irreversible electrical switching in TeO2–V205 based glasses, Journal de Physique IV 2 (1992) C2–185–C2–188.

Messoussi, R.; Bernede, J.C.; Benhida, S.; Abachi, T.; Latef. A., Electrical characterization of M/Se structures (M=Ni, Bi), Mat. Chem. And Phys 28 (1991) 253–258.

Mitkova, M.; Boolchand, P., Microscopic origin of the glass forming tendency in chalogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.–y., Electronic and ionic conduction in (AgxCu1–x)2Se, J. Phys. Soc. Japan 34 (1973) 423–432.

Miyatani, S.–y., Electrical of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys 15 (1976) 849–853.

Narayanan, R.A.; Asokan, S.; Kumar, A., Evidence concerning the effect of topology on electrical switching in chalcogenide network glasses, Phys. Rev. B54 (1996) 4413–4415.

Neale, R.G.; Aseltine, J.A., The application of amorphous meterials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys 29 (1996) 2004–2008.

Rahman, S.; Silvarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen, A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects of non–volatility in a-Si:H Memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal.memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys 8 (1975) L120–L122.

Steventon, A.G., The switching mechanism in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1-x and AsxSe1-x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High performance Metal/sillicide antifuse, IEEE electron dev. Lett. 13 (1992)471–472.

Weirauch, D.F., Threshold switching and thermal filaments in amorphous semiconductors, App. Phys. Lett. 16 (1970) 72–73.

Zhang, M.; Mancini, S.; Bresser, W.; Boolchang, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Liang Y–C, et al: "*Exposure Characteristics of Electron–Beam Induced Silver Doping and Its Application to Grating Device Fabrication in Chalcogenide Glass Films*" Thin Solid Films, vol. 165, No. 1, Nov. 15, 1988 (Nov. 15, 1988), pp. 55–65, XP00082606, ISSN: 040–6090, p. 55–p. 61.

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki, et al., *Nanoscale effects in devices based on chalcogenide solid solutions,* Superlattices and Microstructures, 27, 485–488 (2000).

Kozicki, et al., *Nanoscale phase separation in Ag–Ge–Se glasses,* Microelectronic Engineering, vol. 63/1–3, 155–159 (2002).

M.N. Kozicki and M. Mitkova, *Silver incorporation in thin films of selenium rich Ge–Se glasses,* Proceedings of the XIX International Congress on Glass, Society for Glass Technology, 226–227 (2001).

Hirose, et al., "High Speed Memory Behavior and Reliability of an Amorphous $As_2S_3$ Film Doped with Ag", Jul. 17, 1980, pps. K187–K190.

Hirose, et al., "Polarity–dependent memory switching and behavior of Ag dendrite in Ag–photodoped amorphous $As_2S_3$ films", Journal of Applied Physics, vol. 47, No. 6, Jun. 1976, pps. 2767–2772.

Kawaguchi, et al., "Optical, electrical, and structural properties of amorphous Ag–Ge–S and Ag–Ge–Se films and comparison of photoinduced and thermally induced phenomena of both system,", Journal of Applied Physics, 79, Jun. 1998, pps. 9098–9104.

U.S. patent application Ser. No. 09/797,835, Moore, filed Mar. 1, 2001.

U.S. patent application Ser. No. 09/732,968, Gilton, filed Dec. 8, 2000.

U.S. patent application Ser. No. 09/943,190, Campbell et al., filed Aug. 29, 2001.

U.S. patent application Ser. No. 09/779,983, Moore, filed Feb. 8, 2001.

Kluge et al., "Silver photodiffusion in amorphous $Ge_xSe_{100-x}$", Journal of Non–Crystalline solids 124 (1990) pps. 186–193.

Kolobov, A.V., "Photodoping of amorphous chalcogenides by metals", Advances in Physics, 1991, vol. 40, No. 5, pps. 625–684.

Mitkova, et al. "Dual Chemical Role of Ag as an Additive in Chalcogenide Glasses", Physical Review Letters, vo.. 83, No. 19, 3848–3851.

Mitkova, "Insulating and Semoncinducting Glasses", Editor: P. Boolchand, World Scientific, New Jersey, 2000, pps. 813–843.

Axon Technologies Corporation, Technology Description: *Programmable Metallization Cell (PMC)*, (pre–Jul. 7, 2000) pp. 1–6.

Shimakawa et al., *Photoinduced effects and metastability in amorphous semiconductors and insulators,* 44 Advances in Physics No. 6, 475–588 (Taylor & Francis Ltd. 1995).

D.B. Johnson, et al., "Lateral Diffusion in Ag–Se Thin–Film Couples", Journal of Applied Physics, vol. 40, No. 1, Jan. 1969, pps. 149–152.

Yoji Kawamoto, et al., "Ionic Conduction in $As_2S_3$–$Ag_2S_1$ $GeS_2$–$GeS$–$Ag_2S$ and $P_2S_5$–$Ag_2S$ Glasses," Journal of Non–Crystalline Solids 20, pp. 393–404 (1976).

* cited by examiner

METHOD OF FORMING CHALCOGENIDE COMPRISING DEVICES AND METHOD OF FORMING A PROGRAMMABLE MEMORY CELL OF MEMORY CIRCUITRY

TECHNICAL FIELD

This invention relates to methods of forming non-volatile resistance variable devices and to methods of forming a programmable memory cell of memory circuitry.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in the Kozicki et al. U.S. Pat. Nos. 5,761,115; 5,896,312; 5,914,893; and 6,084,796, which ultimately resulted from U.S. patent application Ser. No. 08/652,706, filed on May. 30, 1996, disclosing what is referred to as a programmable metallization cell. Such a cell includes opposing electrodes having an insulating dielectric material received therebetween. Received within the dielectric material is a fast ion conductor material. The resistance of such material can be changed between highly insulative and highly conductive states. In its normal high resistive state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the fast ion conductor material is such that it undergoes a structural change at a certain applied voltage. With such voltage applied, a conductive dendrite or filament extends between the electrodes, effectively interconnecting the top and bottom electrodes to electrically short them together.

Once this occurs, dendrite growth stops, and is retained when the voltage potentials are removed. Such can effectively result in the resistance of the mass of fast ion conductor material between electrodes dropping by a factor of 1,000. Such material can be returned to its highly resistive state by reversing the voltage potential between the anode and cathode, whereby the filament disappears. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. A specific example is germanium selenide having silver ions diffused therein. The present method of providing the silver ions within the germanium selenide material is to initially chemical vapor deposit the germanium selenide glass without any silver being received therein. A thin layer of silver is thereafter deposited upon the glass, for example by sputtering, physical vapor deposition or other technique. An exemplary thickness is 200 Angstroms or less. The layer of silver is irradiated, preferably with electromagnetic energy at a wavelength less than 500 nanometers. The thin nature of the deposited silver enables such energy to pass through the silver to the silver/glass interface effective to break a chalcogenide bond of the chalcogenide material. This may form $Ag_2Se$, which effectively dopes the glass with silver. The applied energy and overlying silver ultimately result in the silver migrating into the glass layer such that a typical homogenous distribution of silver throughout the layer is achieved.

Saturation of silver in germanium selenide is apparently at a maximum of about 34 atomic percent or less depending on the germanium selenide stoichiometry. Yet, preferred existing technology for cell fabrication constitutes a concentration which is less than the maximum; in the case of 34 atomic percent maximum, an example concentration would be about 27 atomic percent.

After the chalcogenide material is provided with silver to a desired concentration, the top electrode material (typically silver) is next deposited. But, as the silver doping/diffusion into the chalcogenide material approaches the maximum or saturation, some $Ag_2Se$ was discovered to form at the surface and remain there as opposed to diffusing into the glass. Further, the surface $Ag_2Se$ was typically in the form of semicircular nodules or bumps anywhere from 50 Angstroms to 20 microns across. Unfortunately when the typical silver electrode material is subsequently deposited, such tends to mound on top of these previous bumps. This can create voids to the doped germanium glass through the top electrode material, whereby the silver doped germanium selenide glass is partially exposed. Unfortunately, some of the photodeveloper solutions typically used for patterning the top electrode (i.e. tetramethyl ammonium hydroxide) will etch the glass that is exposed.

It would be desirable to overcome or at least reduce this problem. While the invention was principally motivated in overcoming this problem, it is in no way so limited. The artisan will appreciate applicability of the invention in other aspects unrelated to the problem, with the invention only being limited by the accompanying claims as literally worded and as appropriately interpreted in accordance with the doctrine of equivalents.

SUMMARY

The invention includes methods of forming a programmable memory cell of memory circuitry and non-volatile resistance variable devices. In one implementation, a method of forming a non-volatile resistance variable device includes forming a first conductive electrode material on a substrate. Chalcogenide comprising material is formed over the first conductive electrode material. The chalcogenide material comprises $A_xSe_y$, where "A" comprises at least one element which is selected from Group 13, Group 14, Group 15, or Group 17 of the periodic table. A silver comprising layer is formed over the chalcogenide material. The silver is irradiated effective to break a chalcogenide bond of the chalcogenide material at an interface of the silver comprising layer and chalcogenide material and diffuse at least some of the silver into the chalcogenide material, and an outer surface of the chalcogenide material is formed. After the irradiating, the chalcogenide material outer surface is exposed to an iodine comprising fluid effective to reduce roughness of the chalcogenide material outer surface from what it was prior to the exposing. After the exposing, a second conductive electrode material is deposited over the chalcogenide material, and which is continuous and completely covering at least over the chalcogenide material, and the second conductive electrode material is formed into an electrode of the device.

Other implementations and aspects are contemplated and disclosed.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
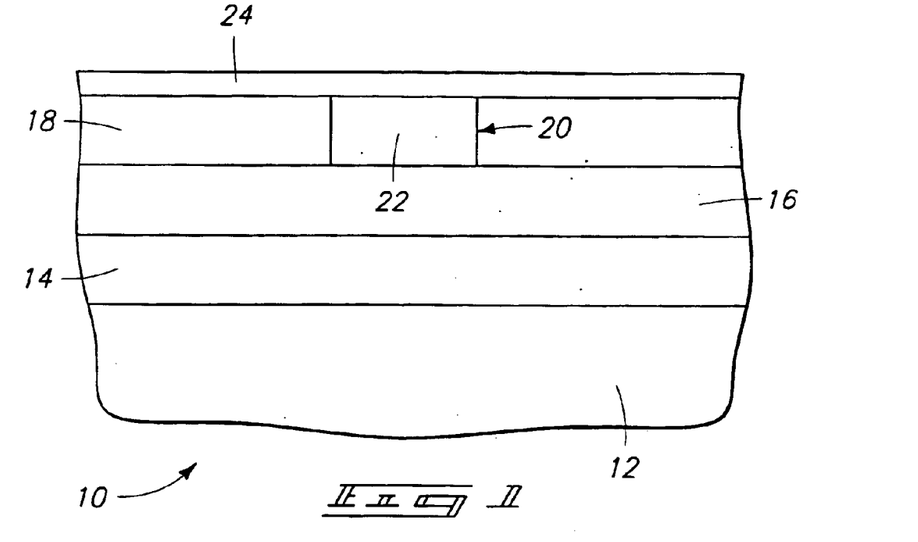
FIG. 1 is a diagrammatic sectional view of a semiconductor wafer fragment in process in accordance with an aspect of the invention.

Referring to FIG. 1, a semiconductor wafer fragment 10 is shown in but one preferred embodiment of a method of forming a non-volatile resistance variable device. By way of example only, example such devices include programmable metallization cells and programmable optical elements of the patents referred to above, further by way of example only, including programmable capacitance elements, programmable resistance elements, programmable antifuses of integrated circuitry and programmable memory cells of memory circuitry. The above patents are herein incorporated by reference. The invention contemplates the fabrication techniques and structure of any existing non-volatile resistance variable device, as well as yet-to-be developed such devices. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Further, it will be appreciated by the artisan that "resistance variable device" includes devices wherein a property or properties in addition to resistance is/are also varied. For example, and by way of example only, the device's capacitance and/or inductance might also be changed in addition to resistance.

Semiconductor wafer fragment 10 comprises a bulk monocrystalline semiconductive material 12, for example silicon, having an insulative dielectric layer 14, for example silicon dioxide, formed thereover. A first conductive electrode material 16 is formed over dielectric layer 14. By way of example only, preferred materials include any of those described in the incorporated Kozicki et al. patents referred to above in conjunction with the preferred type of device being fabricated. A dielectric layer 18 is formed over first electrode material 16. Silicon nitride is a preferred example.

An opening 20 is formed through layer 18 to conductive electrode layer 16. Such is filled with a chalcogenide comprising material 22 to a first thickness, which in this example is essentially defined by the thickness of layer 18. By way of example only, an exemplary first thickness range is from 100 Angstroms to 1000 Angstroms. The chalcogenide comprising material comprises $A_xSe_y$, where "A" comprises at least one element which is selected from Group 13 (B, Al, Ga, In, Tl), Group 14 (C, Si, Ge, Sn, Pb), Group 15 (N, P, As, Sb, Bi), or Group 17 (F, Cl, Br, I, At) of the periodic table. By way of example only, preferred elements for "A" are Ge and Si. An example preferred method of forming material 22 over substrate 10 is by chemical vapor deposition to completely fill opening 20, followed by a planarization technique, for example chemical mechanical polishing. Material 22 is preferably formed to be amorphous and remains amorphous in the finished device.

A silver comprising layer 24 is formed to a second thickness over chalcogenide material 22. Silver comprising layer 24 is preferably predominately (majority) elemental silver, and can consist or consist essentially of elemental silver. In one preferred embodiment, the second thickness is at least 30% of the first thickness.

Figure 2:
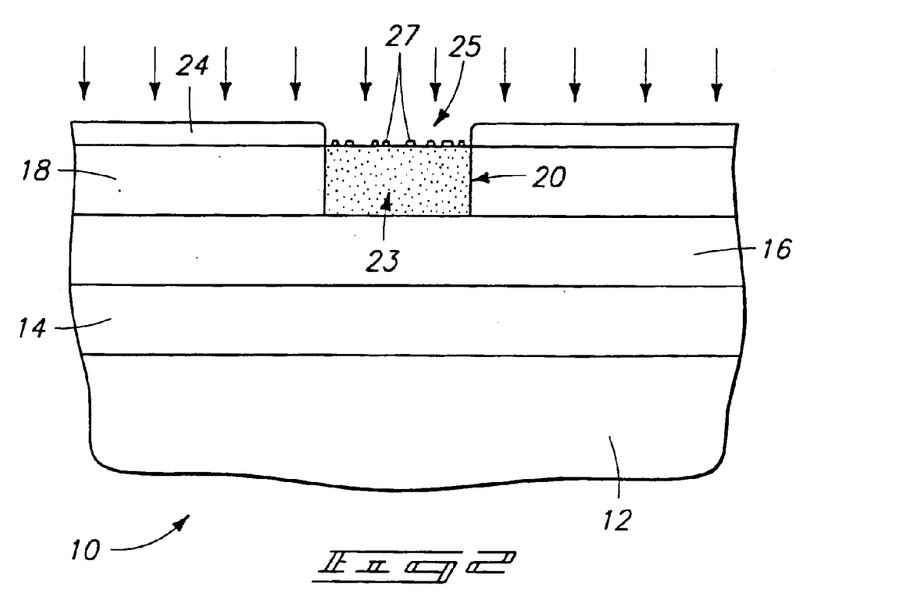
FIG. 2 is a view of the FIG. 1 wafer fragment at a processing step subsequent to that shown by FIG. 1.

Referring to FIG. 2, silver comprising layer 24 is irradiated effective to break the chalcogenide bond of chalcogenide material 22 at an interface of silver comprising layer 24 and chalcogenide material 22, and diffuse at least some of the silver into chalcogenide material 22. In FIG. 2, material 22 is designated with numeral 23 and peppered in the drawing to indicate metal ions being received therein. A preferred irradiating includes exposure to actinic radiation having a wavelength from about 164–904 nanometers, with radiation exposure at between 404–408 nanometers being a more specific example. A more specific example is a flood UV exposure tool operating at 4.5 milliwatts/cm$^2$ energy for 15 minutes in an oxygen-containing ambient at room temperature and pressure. All of material 24 received directly over chalcogenide comprising material 22 might be diffused to within such material, or only some portion thereof might. The thickness of layer 24 is also chosen to be suitably thin to enable the impinging electromagnetic radiation to essentially transparently pass through material 24 to the interface of such material with chalcogenide material 22. An exemplary preferred thickness is less than or equal to 200 Angstroms. Further, the apparent linear thickness of layer 24 as a percentage of the linear thickness of chalcogenide material 22 effectively results in the same approximate metal incorporation in atomic percent within the chalcogenide material. Regardless, such results in chalcogenide material 23 having an outer surface 25.

In but one embodiment, outer surface 25 is characterized by the formation of $Ag_2Se$ as at least part of the outer surface, with in one embodiment, the irradiating being effective to form a discontinuous layer 27 of $Ag_2Se$ formed over chalcogenide comprising materials 22/23. Further preferably, the irradiating is effective to maintain the chalcogenide material underlying the $Ag_2Se$ in a substantially amorphous state. Even further preferably, the irradiating is effective to dope the chalcogenide comprising material to average at least 30 atomic percent silver in a lowest of a plurality of variable resistant states. Further, the invention contemplates any other method of forming Ag$_2$Se over chalcogenide comprising material, and for example a discontinuous layer of Ag$_2$Se, by any other existing or yet-to-be-developed methods.

Figure 3:
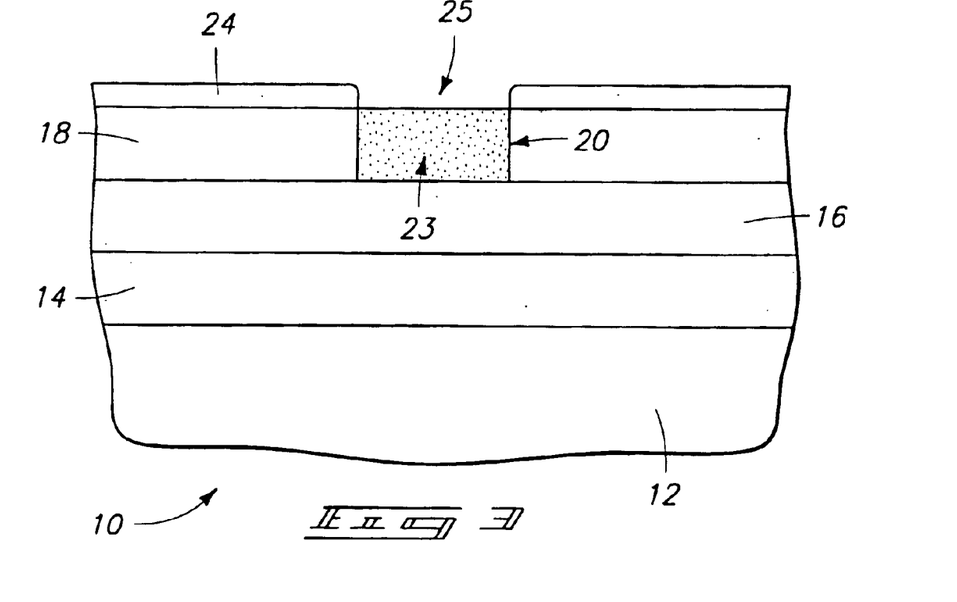
FIG. 3 is a view of the FIG. 1 wafer fragment at a processing step subsequent to that shown by FIG. 2.

Referring to FIG. 3 and after the irradiating, chalcogenide material outer surface 25 is exposed to an iodine comprising fluid effective to reduce roughness of chalcogenide material outer surface 25 from what it was prior to the exposing. In one preferred embodiment, such exposing occurs to Ag$_2$Se to be effective to etch away at least some of the Ag$_2$Se, more preferably effective to etch away at least a majority of the Ag$_2$Se, and most preferably effective to etch away substantially all of the Ag$_2$Se, as shown in FIG. 3. In one exemplary embodiment, roughness reduction is contemplated independent of Ag$_2$Se formation and removal. Further in one exemplary embodiment, etching away of at least some Ag$_2$Se is contemplated independent of the effect on surface roughness.

One preferred iodine comprising fluid is a liquid, for example an iodide solution such as a potassium iodide solution. An example preferred potassium iodide solution comprises from 5 to 30 grams of I$_2$ per one liter of a from 20% to 50% by volume potassium iodide solution. Exposure to a vapor, a liquid solution at for example ambient temperature and pressure conditions, or elevated or reduced from ambient temperature and/or pressure conditions is of course also contemplated. A specific example is dipping the substrate into a potassium iodide solution comprising 20 grams of I$_2$ per one liter of a 30% potassium iodide solution.

Figure 4:
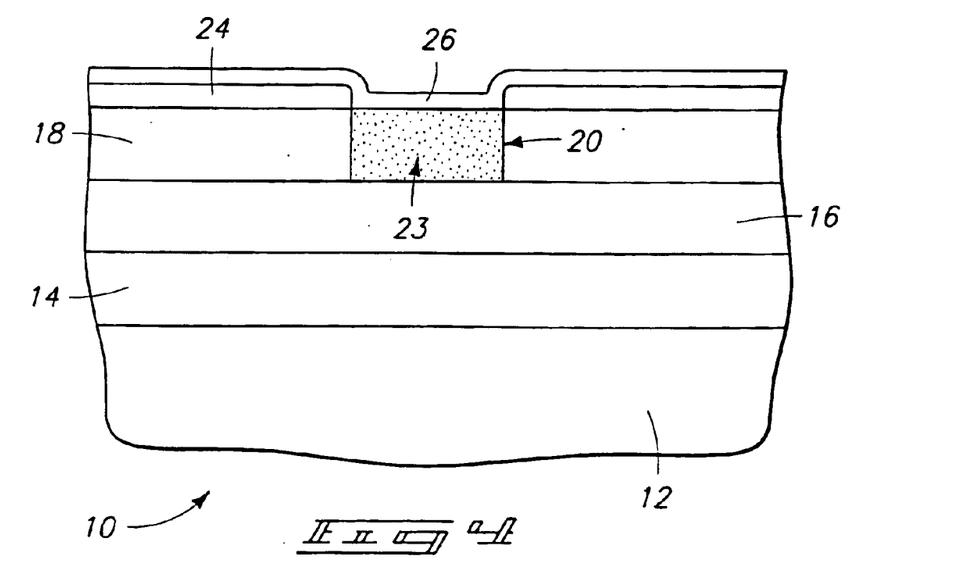
FIG. 4 is a view of the FIG. 1 wafer fragment at a processing step subsequent to that shown by FIG. 3.

Referring to FIG. 4 and after the exposing, a second conductive electrode material 26 is deposited over chalcogenide material 23. In the preferred embodiment, such second conductive electrode material is continuous and completely covers at least over chalcogenide material 23. An example preferred thickness range for second electrode material 26 is from 140 Angstroms to 200 Angstroms. The first and second conductive electrode materials might be the same material(s), or different material(s). By way of example only, preferred top and bottom electrode materials include silver, tungsten, platinum, nickel, carbon, chromium, molybdenum, aluminum, magnesium, copper, cobalt, palladium, vanadium, titanium, alloys thereof and compounds including one or more of these elements. In accordance with a preferred programmable metallization cell embodiment, and where "A" is Ge, at least one of materials 16 and 26 constitutes silver. During the formation of layer 26, some of it might diffuse into layer 23.

Figure 5:
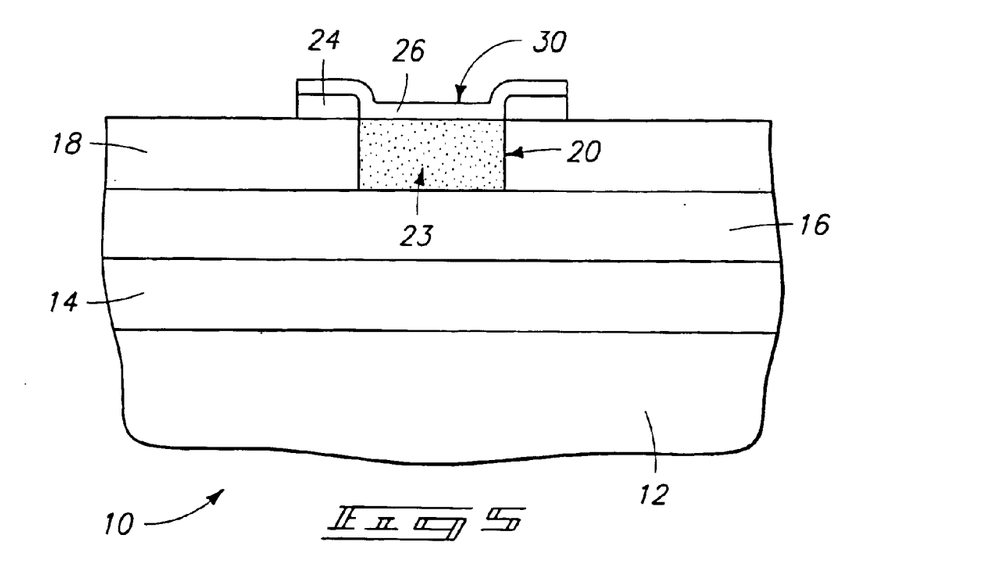
FIG. 5 is a view of the FIG. 1 wafer fragment at a processing step subsequent to that shown by FIG. 4.

Referring to FIG. 5, material 26 is patterned into an electrode 30. Patterning to produce electrode 30 is typically and preferably conducted utilizing photolithography. Such provides but one preferred example of forming a second electrode material operatively proximate the chalcogenide material. In a preferred embodiment, such results in the formation of a non-volatile resistance variable device which is fabricated into a programmable memory cell of memory circuitry.

Figure 6:
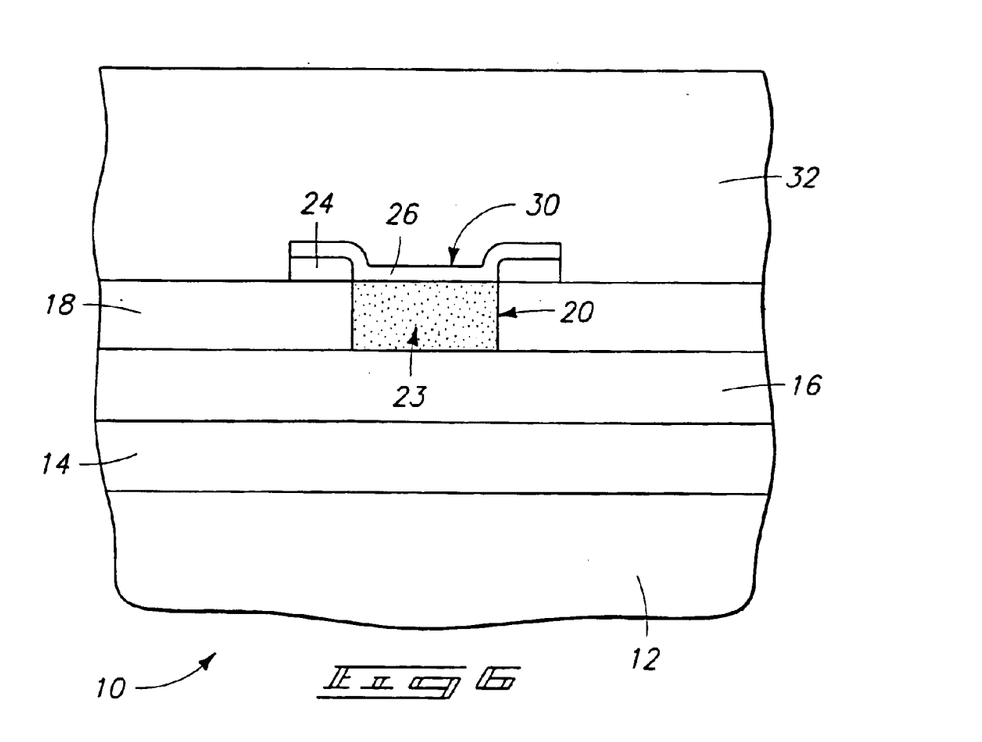
FIG. 6 is a view of the FIG. 1 wafer fragment at a processing step subsequent to that shown by FIG. 5.

Referring to FIG. 6, one or more dielectric layers 32 are ultimately formed over the device. Of course, intervening conductive and semiconductive layers might also be provided to form other lines and devices outwardly of the depicted device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a chalcogenide comprising device, comprising:

forming a first conductive electrode material on a substrate;

forming chalcogenide comprising material over the first conductive electrode material, the chalcogenide material comprising AxSey, where "A" at least one element which is selected from Group 13, Group 14, Group 15, or Group 17 of the periodic table;

forming a silver comprising layer over the chalcogenide material;

irradiating the silver effective to break a chalcogenide bond of the chalcogenide material at an interface of the silver comprising layer and chalcogenide material and diffuse at least some of the silver into the chalcogenide material, and forming an outer surface of the chalcogenide material;

after the irradiating, exposing the chalcogenide material outer surface to an iodine comprising fluid effective to reduce roughness of the chalcogenide material outer surface from what it was prior to the exposing; and after the exposing, depositing a second conductive electrode material over the chalcogenide material, and which is continuous and completely covering at least over the chalcogenide material, and forming the second conductive electrode material into an electrode of the device.

2. The method of claim 1 wherein the iodine comprising fluid is a liquid.

3. The method of claim 1 wherein the iodine comprising fluid is an iodide solution.

4. The method of claim 1 wherein the iodine comprising fluid is a potassium iodide solution.

5. The method of claim 4 wherein the potassium iodide solution comprises from 5 to 30 grams I2 per 1 liter of a from 20% to 50% potassium iodide solution.

6. The method of claim 1 wherein the silver comprising layer is predominately elemental silver.

7. The method of claim 1 wherein the irradiating is effective to form Ag2se as at least part of the outer surface, the etching being effective to etch away at least some of the Ag2Se and thereby at least partially contributing to said roughness reducing.

8. The method of claim 1 wherein "A" comprises Ge.

9. The method of claim 1 comprising forming the device into a programmable memory cell of memory circuitry.

10. The method of claim 1 wherein the first and second conductive electrode materials are different.

11. A method of forming a chalcogenide comprising device, comprising:

forming a first conductive electrode material on a substrate;

forming a chalcogenide comprising material over the first conductive electrode material, the chalcogenide material comprising AxSey, where "A" comprises at least one element which is selected from Group 13, Group 14, Group 15, or Group 17 of the periodic table;

after forming the chalcogenide comprising material, forming Ag2Se over the chalcogenide comprising material;

after the irradiating, exposing the Ag2Se to an iodine comprising fluid effective to etch away at least some of the Ag2Se; and after the exposing, depositing a second conductive electrode material over the chalcogenide material and forming the second conductive electrode material into an electrode of the device.

12. A method of forming a non-volatile resistance variable device, comprising:

forming a first conductive electrode material on a substrate;

forming a chalcogenide comprising material over the first conductive electrode material, the chalcogenide material comprising AxSey, where "A" is selected from the group consisting of elements and radicals and mixtures thereof which are more electropositive than Se;

after forming the chalcogenide comprising material, forming Ag2Se over the chalcogenide comprising material;

after the irradiating, exposing the Ag2Se to an iodine comprising fluid effective to etch away at least some of the Ag2Se; and after the exposing, depositing a second conductive electrode material over the chalcogenide material and forming the second conductive electrode material into an electrode of the device.

13. The method of claim 11 comprising forming the device into a programmable memory cell of memory circuitry.

14. The method of claim 12 wherein "A" comprises Ge.

15. The method of claim 12 comprising forming the non-volatile resistance variable device into a programmable memory cell of memory circuitry.

16. The method of claim 12 wherein the iodine comprising fluid is a liquid.

17. The method of claim 12 wherein the iodine comprising fluid is an iodide solution.

18. The method of claim 12 wherein the iodine comprising fluid is a potassium iodide solution.

19. The method of claim 18 wherein the potassium iodide solution comprises from 5 to 30 grams I2 per 1 liter of a from 20% to 50% potassium iodide solution.

20. A method of forming a chalcogenide comprising device, comprising:

forming a first conductive electrode material on a substrate;

forming a chalcogenide comprising material over the first conductive electrode material, the chalcogenide material comprising AxSey, where "A" comprises at least one element which is selected from Group 13, Group 14, Group 15, or Group 17 of the periodic table;

after forming the chalcogenide comprising material, forming a discontinuous layer of Ag2Se over the chalcogenide comprising material;

after the irradiating, exposing the Ag2Se to an iodine comprising fluid effective to etch away at least some of the Ag2Se; and after the exposing, depositing a second conductive electrode material over the chalcogenide material, and which is continuous and completely covering at least over the chalcogenide material, and forming the second conductive electrode material into an electrode of the device.

21. The method of claim 12 wherein the exposing is effective to etch away substantially all of the Ag2Se.

22. A method of forming a non-volatile resistance variable device, comprising:

forming a first conductive electrode material on a substrate;

forming a chalcogenide comprising material over the first conductive electrode material, the chalcogenide material comprising AxSey, where "A" is selected from the group consisting of elements and radicals and mixtures thereof which are more electropositive than Se;

after forming the chalcogenide comprising material, forming a discontinuous layer of Ag2Se over the chalcogenide comprising material;

after the irradiating, exposing the Ag2Se to an iodine comprising fluid effective to etch away at least some of the Ag2Se; and after the exposing, depositing a second conductive electrode material over the chalcogenide material, and which is continuous and completely covering at least over the chalcogenide material, and forming the second conductive electrode material into an electrode of the device.

23. The method of claim 22 wherein the iodine comprising fluid is a liquid.

24. The method of claim 22 wherein the iodine comprising fluid is an iodide solution.

25. The method of claim 22 wherein the iodine comprising fluid is a potassium iodide solution.

26. The method of claim 25 wherein the potassium iodide solution comprises from 5 to 30 grams I2 per 1 liter of a from 20% to 50% potassium iodide solution.

27. The method of claim 22 doping the chalcogenide comprising material to at least 30 atomic percent Ag in a lowest of a plurality of variable resistance states.

28. The method of claim 22 wherein the exposing is effective to etch away substantially all of the Ag2Se.

29. A method of forming a programmable memory cell of memory circuitry, comprising:

forming a first conductive electrode material on a substrate;

forming a substantially amorphous chalcogenide comprising material over the first conductive electrode material, the chalcogenide material comprising AxSey, where "A" is selected from the group consisting of elements and radicals and mixtures thereof which are more electropositive than Se;

forming a silver comprising layer over the chalcogenide comprising material;

irradiating the silver effective to break a chalcogenide bond of the chalcogenide material at an interface of the silver comprising layer and chalcogenide material and diffuse at least some of the silver into the chalcogenide material, the irradiating being effective to form a discontinuous layer of Ag2Se over the chalcogenide comprising material, the irradiating being effective to maintain the chalcogenide material underlying the Ag2Se in a substantially amorphous state, the irradiating being effective to dope the chalcogenide comprising material to average at least 30 atomic percent silver in a lowest of a plurality of variable resistance states;

after the irradiating, exposing the Ag2Se to an iodine comprising fluid effective to etch away at least a majority of the Ag2Se; and after the exposing, depositing a second conductive electrode material over the chalcogenide material, and which is continuous and completely covering at least over the chalcogenide material, and forming the second conductive electrode material into an electrode of the device.

30. The method of claim 29 wherein the iodine comprising fluid is a liquid.

31. The method of claim 29 wherein the iodine comprising fluid is an iodide solution.

32. The method of claim 29 wherein the iodine comprising fluid is a potassium iodide solution.

33. The method of claim 32 wherein the potassium iodide solution comprises from 5 to 30 grams ˆ per 1 liter of a from 20% to 50% potassium iodide solution.

34. A method of forming a chalcogenide structure, comprising:
  forming a chalcogenide glass layer;
  forming a metal-containing layer over the chalcogenide glass layer;
  irradiating said metal-containing layer to break a chalcogenide bond of the chalcogenide glass layer at the interface of the metal-containing layer and chalcogenide glass layer, such that at least a portion of the metal-containing layer diffuses into the chalcogenide glass layer; and,
  after said step of irradiating, exposing an outer surface of the chalcogenide glass layer to an iodine comprising fluid, wherein said iodine comprising fluid removes at least a portion of said outer surface that has been irradiated.

35. The method of claim 34, wherein the iodine comprising fluid is a liquid.

36. The method of claim 34, wherein the iodine comprising fluid is an iodide comprising solution.

37. The method of claim 34, wherein the iodine comprising fluid is a potassium iodide solution.

38. The method of claim 37, wherein the potassium iodide solution comprises from 5 to about 30 grams $I_2$ per liter of a from 20% to about a 50% potassium iodide solution.

39. The method of claim 34, wherein the irradiating is effective to form $Ag_2Se$ as at least part of the outer surface, the etching being effective to etch away at least some of the $Ag_2Se$.

40. The method of claim 34, wherein the metal-containing layer is a silver comprising layer.

41. The method of claim 40, wherein the silver comprising layer is predominately elemental silver.

42. A method of forming a chalcogenide structure, comprising:
  forming a first conductive layer on a semiconductor substrate;
  forming a chalcogenide glass layer over said first conductive layer;
  forming a metal-containing layer over said chalcogenide glass layer;
  irradiating said metal-containing layer to break a chalcogenide bond of the chalcogenide glass layer at the interface of the metal-containing layer and chalcogenide glass layer thereby creating an outside surface;
  removing at least a portion of said outside surface by etching with an iodine comprising fluid; and,
  after said step of removing at least a portion of said outside surface, forming a second conductive layer over at least a portion of the outside surface remaining after said act of removing.

43. The method of claim 42, wherein the iodine comprising fluid is a liquid.

44. The method of claim 42, wherein the iodine comprising fluid is an iodide comprising solution.

45. The method of claim 42, wherein the iodine comprising fluid is a potassium iodide solution.

46. The method of claim 45, wherein the potassium iodide solution comprises from 5 to about 30 grams $I_2$ per liter of a from 20% to about a 50% potassium iodide solution.

47. The method of claim 42, wherein the irradiating is effective to form $Ag_2Se$ as at least part of the outside surface, the etching being effective to etch away at least some of the $Ag_2Se$.

48. The method, of claim 42, wherein the metal-containing layer is a silver comprising layer.

49. The method of claim 48, wherein the silver comprising layer is predominately elemental silver.

50. The method of claim 42, wherein said first conductive layer and second conductive layer are electrodes.

51. A method of forming a chalcogenide structure, comprising:
  forming a first conductive layer on a semiconductor substrate;
  forming a chalcogenide glass layer over said first conductive layer;
  forming a metal-containing layer over said chalcogenide glass layer;
  irradiating said metal-containing layer to break a chalcogenide bond of the chalcogenide glass layer at the interface of the metal-containing layer and chalcogenide glass layer thereby creating an outside surface, said step of irradiating is effective to form $Ag_2Se$ as at least part of the outside surface;
  removing at least a portion of said outside surface by etching with an iodine comprising fluid, said etching being effective to etch away at least some of the $Ag_2Se$; and,
  after said step of removing at least a portion of said outside surface, forming a second conductive layer over at least a portion of the outside surface remaining after said act of removing.

* * * * *